United States Patent
Frey et al.

(10) Patent No.: US 9,658,372 B2
(45) Date of Patent: May 23, 2017

(54) OPTICAL FILTERING STRUCTURE IN THE VISIBLE AND/OR INFRARED DOMAIN

(71) Applicant: COMMISSARIAT A L'ENERGIE ATOMIQUE ET AUX ENE ALT, Paris (FR)

(72) Inventors: Laurent Frey, Fontaine (FR); Marilyn Armand, Grenoble (FR); Catherine Pelle, Longechenal (FR)

(73) Assignee: Commissariat à l'énergie atomique et aux énergies alternatives, Paris (FR)

( * ) Notice: Subject to any disclaimer, the term of this patent is extended or adjusted under 35 U.S.C. 154(b) by 164 days.

(21) Appl. No.: 13/950,707

(22) Filed: Jul. 25, 2013

(65) Prior Publication Data

US 2014/0034835 A1 Feb. 6, 2014

(30) Foreign Application Priority Data

Jul. 31, 2012 (FR) ...................................... 12 57422

(51) Int. Cl.
*H04N 5/335* (2011.01)
*G02B 5/20* (2006.01)
(Continued)

(52) U.S. Cl.
CPC ............ *G02B 5/208* (2013.01); *G01J 1/0437* (2013.01); *G01J 5/0862* (2013.01); *G02B 5/201* (2013.01);
(Continued)

(58) Field of Classification Search
CPC ...................................................... G03C 17/36
(Continued)

(56) References Cited

U.S. PATENT DOCUMENTS 4,189,205 A * 2/1980 Vandehei ................ C03C 17/36
359/360
5,140,457 A * 8/1992 Letter ........................... 359/359
(Continued)

FOREIGN PATENT DOCUMENTS

EP 1 592 067 A1 11/2005
WO WO 2008/012235 A1 1/2008
(Continued)

OTHER PUBLICATIONS

French Preliminary Search Report issued Mar. 20, 2013, in French Application No. 12 57422 filed Jul. 31, 2012 (with English Translation of Categories of Cited Documents).
(Continued)

*Primary Examiner* — Audrey Y Chang
(74) *Attorney, Agent, or Firm* — Oblon, McClelland, Maier & Neustadt, L.L.P.

(57) ABSTRACT

An optical filtering structure comprising a stack of layers forming a first filter letting pass a first spectral band, and a second filter adjacent to the first filter and which lets pass a second spectral band comprising: a plurality of dielectric layers common to the two filters and of different refractive indices, n first metal layers common to the two filters, m second metal layers arranged only in the second filter, and wherein at least one of said dielectric layers comprises, in the first filter, a thickness different to that in the second filter, and/or wherein at least one dielectric layer is arranged only in the second filter, n being an integer greater than or equal to 0, and m being an integer greater than or equal to 1.

17 Claims, 4 Drawing Sheets

(51) Int. Cl.
*G02B 5/28* (2006.01)
*H01L 31/0232* (2014.01)
*G01J 1/04* (2006.01)
*G01J 5/08* (2006.01)
*H01L 27/146* (2006.01)

(52) U.S. Cl.
CPC .............. *G02B 5/281* (2013.01); *G02B 5/285* (2013.01); *H01L 27/14621* (2013.01); *H01L 31/0232* (2013.01); *Y10T 29/49826* (2015.01)

(58) Field of Classification Search
USPC ........ 359/585, 586, 590, 584, 587; 257/432, 257/431; 250/226; 348/273
See application file for complete search history.

(56) References Cited

U.S. PATENT DOCUMENTS

| | | | |
|---|---|---|---|
| 5,337,191 A * | 8/1994 | Austin | 359/885 |
| 6,007,901 A * | 12/1999 | Maschwitz | C03C 17/36 359/580 |
| 6,031,653 A | 2/2000 | Wang | |
| 7,924,504 B2 * | 4/2011 | Su et al. | 359/586 |
| 8,277,883 B2 * | 10/2012 | Chen et al. | 427/215 |
| 2008/0251873 A1 | 10/2008 | Kasano et al. | |
| 2009/0225204 A1* | 9/2009 | Inaba et al. | 348/273 |
| 2009/0321865 A1 | 12/2009 | Kasano et al. | |
| 2011/0228097 A1 | 9/2011 | Motta | |

FOREIGN PATENT DOCUMENTS

| | | |
|---|---|---|
| WO | WO 2010/046369 A1 | 4/2010 |
| WO | WO 2010/096914 A1 | 9/2010 |

OTHER PUBLICATIONS

Alexander V. Tikhonravov, et al., "Application of the needle optimization technique to the design of optical coatings", Applied Optics, vol. 35, No. 28, Oct. 1, 1996, pp. 5493-5508.

H.A. MacLeod, "A new approach to the design of metal-dielectric thin-film optical coatings", Optica Acta, Journal of Modern Optics, vol. 25, No. 2, 1978, pp. 93-106.

* cited by examiner

FIG. 8

OPTICAL FILTERING STRUCTURE IN THE VISIBLE AND/OR INFRARED DOMAIN

TECHNICAL FIELD

This document relates to an optical filtering structure comprising two adjacent optical filters, one letting pass a first spectral band and cutting off a second spectral band (for example of the visible pass and infrared cut off type), and the other letting pass the second spectral band and cutting off the first spectral band (for example of the infrared pass and visible cut off type). Such a filtering structure may for example be used in a photodetector and/or photoemitter type device to carry out, on a same light emission and/or reception support, both a filtering in the visible domain and a filtering in the infrared domain, particularly the near infrared, or instead different filterings in the visible domain.

The invention may advantageously be used in the field of photodetector and/or photoemitter components having in particular the function of detecting and/or emitting light in different spectral bands according to the position on the component. Such a component may correspond to an array sensor based on silicon, of CMOS or CCD type, with or without an optical imaging system, able to detect visible light (in other words the wavelengths comprised between around 400 nm and 700 nm), for example the colours green and blue on a first set of pixels and the colour red on a second set of pixels, or instead detect visible light on a first set of pixels, and the near infrared light (all or part of the domain 700 nm-1100 nm) on a second set of pixels.

The invention may apply particularly to the fields of human-machine interfaces, video game or 3D television controls, automobile driving aids, endoscopy, etc.

PRIOR ART

Figure 1:
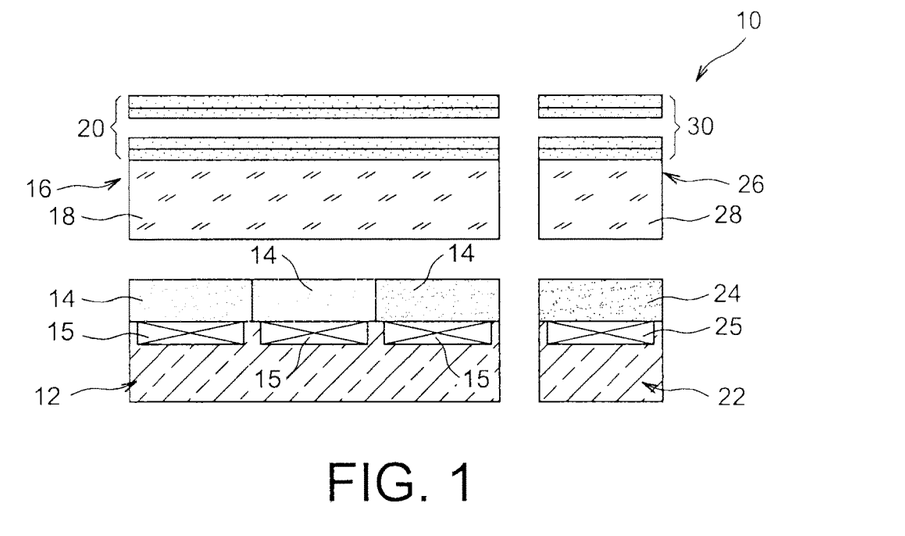
FIG. 1 represents a photodetector device of the prior art functioning in the visible and infrared domains.

FIG. 1 represents a photodetector device 10 able to carry out a light detection both in the visible domain and in the near infrared domain. The device 10 uses two separate sensors, one for the wavelengths of the visible domain and the other for the wavelengths of the infrared domain.

The device 10 comprises a first CMOS sensor 12 intended to carry out a detection in the visible domain. Coloured organic resins 14, forming for example a Bayer array and making it possible to carry out a RGB (red, green and blue) filtering, are arranged on the first sensor 12. These resins 14 are directly integrated on the first sensor 12, each being associated with a pixel 15 of the sensor 12. The spectral responses of coloured resins 14 do not make it possible, on their own, to reconstitute correctly the colours due to their non-negligible transmission in the near infrared domain. An additional filter 16 is thus generally added above the resins 14. This additional filter 16 makes it possible to cut off the undesirable wavelengths of the near infrared domain, while transmitting efficiently the wavelengths of the visible domain.

This additional filter 16 comprises a glass substrate 18 on which are made numerous dielectric layers 20 (typically around thirty) superimposed on each other and made such that they assure the function of infrared cut off and visible pass filter.

The device 10 comprises a second CMOS sensor 22 intended to carry out a detection in the infrared domain. A black resin 24 of low transmission in the visible domain and high transmission in the infrared domain is arranged above the pixels 25 of the second sensor 22. An infrared pass filter 26 is also added above the black resin 21. This filter 26 comprises a glass substrate 28 on which are made numerous dielectric layers 30 superimposed on each other and formed such that they assure the function of infrared pass filter. The filter 26 lets pass a part of the wavelengths of the visible domain, these wavelengths being nevertheless filtered by the black resin 24.

Such a device 10 does not make it possible to have pixels provided to detect the visible domain and pixels provided to detect the infrared domain that are intermingled within a unique sensor, barring integrating the two dielectric multilayer filters 16 and 26 directly on the pixels (the glass substrates 18 and 28 are in this case absent), which represents a very complex operation to carry out given the high number of dielectric layers 20 and 30 to deposit for each of the filters 16 and 26, and long and critical etching operations given the high thickness of dielectric to etch (the dielectric layers 20 and 30 having to be made successively).

The document US 2009/321865 A1 describes an imaging device adapted to detect simultaneously the wavelengths of the visible and infrared domain on a same detection array. A dielectric multilayer filter of this device, the dielectric layers of which are common to the visible and infrared parts of the filter, comprises one or two dielectric layers of variable thickness and thus assures a differentiated filtering of the colours red, green and blue, as well as the infrared, as a function of the thickness of these dielectric layers.

Compared to the device shown in FIG. 1, the solution proposed in the document US 2009/321865 A1 enables the detection simultaneously of the wavelengths of the visible and infrared domains on a same detection array. On the other hand, on account of the fact that this solution does not use an infrared cut off filter, the part of the filter assuring the filtering in the visible domain lets pass a part of the wavelengths of the infrared domain. It is thus necessary to subtract the measuring signal delivered by the pixels of the infrared part from the measuring signals delivered by the pixels of the part of the visible domain in order to obtain correct RGB measuring signals. Although such a device does not require an infrared cut off filter, the subtraction operation has the major drawback of degrading the signal to noise ratio of the device. Furthermore, the number of dielectric layers to carry out the filtering is also high (18 layers of $TiO_2$ or $SiO_2$), which implies a large number of technological steps for the manufacture of this device.

The problems exposed above are also found for an optical filtering structure intended to carry out filterings of different spectral bands only in the visible domain, or instead of different spectral bands only in the infrared domain.

DESCRIPTION OF THE INVENTION

Thus there is a need to propose a filtering structure making it possible to carry out a first filtering able to let pass a first spectral band and cut off a second spectral band, and a second filtering able to let pass the second spectral band and cut off the first spectral band, which is adapted to function with a single detection and/or emission array the visible and/or infrared domains, and uses a lower number of dielectric layers than filtering structures of the prior art.

Another aim is to propose a filtering structure making it possible to carry out, in a juxtaposed manner, a first visible pass and infrared cut off filtering, and a second infrared pass and visible cut off filtering without having to resort to a black resin, which is adapted to function with a single detection and/or emission array in the visible and infrared domains, and which uses a lower number of dielectric layers than filtering structures of the prior art.

One embodiment proposes an optical filtering structure comprising a stack of layers forming at least one first filter able to let pass the wavelengths of a first spectral band and cut off the wavelengths of a second spectral band, and a second filter adjacent to the first filter and able to let pass the wavelengths of the second spectral band and cut off the wavelengths of the first spectral band, wherein the stack of layers comprises:

- a plurality of dielectric layers common to the first filter and to the second filter and forming an alternation of layers of different refractive indices;
- n first metal layers common to the first filter and to the second filter;
- m second metal layers arranged only in the second filter;
- and wherein at least one of said dielectric layers comprises, in the first filter, a thickness different to that in the second filter, and/or wherein at least one dielectric layer is arranged only in the first or the second filter;
- n being an integer greater than or equal to 0, and m being an integer greater than or equal to 1.

One embodiment also proposes an optical filtering structure comprising a stack of layers forming at least one first filter able to let pass the wavelengths of the visible domain and cut off the wavelengths of the infrared domain, and a second filter adjacent to the first filter (or juxtaposed to the first filter) and able to let pass the wavelengths of the infrared domain and cut off the wavelengths of the visible domain, wherein the stack of layers comprises:

- a plurality of dielectric layers common to the first filter and to the second filter and forming an alternation of layers of different refractive indices;
- n first metal layers common to the first filter and to the second filter;
- m second metal layers arranged only in the second filter;
- and wherein at least one of said dielectric layers comprises, in the first filter, a thickness different to that in the second filter, and/or wherein at least one dielectric layer is arranged only in the second filter;
- n being an integer greater than or equal to 0, and m being an integer greater than or equal to 1.

This filtering structure thus forms filters juxtaposed in different ranges of wavelengths, for example in the visible and the infrared, forming for example RGB and IR filters, which may be integrated on a same detection and/or emission array, the formation complexity of which is limited. Such a filtering structure may use metals such as copper or aluminium commonly used in micro-electronics.

The use of a metal such as copper of which the real part of the refractive index has high values (greater than 1) in the visible domain moreover makes it possible to reduce the sensitivity of the angle of incidence of the first filter.

Another embodiment proposes a filtering structure comprising at least two juxtaposed elementary filters, each having a spectral response centred on a different wavelength, made with n metal layers for the first filter (with $n \geq 0$) and n+m metal layers for the second filter (with $m \geq 1$), alternating with dielectric layers of different refractive indices, and such that at least one of the dielectric layers comprises a different thickness in the two filters and/or that at least one dielectric layer is arranged only in the second filter (in contrast with the dielectric layers common to the first filter and to the second filter which are arranged in the two filters).

In an unexpected manner for those skilled in the art (unexpected on account of the fact that certain metals such as copper have a real part of the refractive index which varies widely between the range of wavelengths less than around 600 nm with high values and the range of wavelengths greater than around 600 nm, of which the near infrared domain forms part, with values less than around 0.5, and that the thickness of the dielectric layers of filters of the prior art is directly correlated with the central wavelength of a filter), it has appeared that it is possible to design and form a first filter letting pass a first range of wavelengths and cutting off a second range of wavelengths separate from the first range, for example of visible pass and infrared cut off type, and a second filter letting pass the second range of wavelengths and cutting off the first range of wavelengths, for example of infrared pass and visible cut off type, with a stack of dielectric layers within which is arranged at least one metal layer to make the second filter and comprising few layers (for example less than 10) of variable thickness between the two filters and/or present only in the second filter, the other dielectric layers comprising a same thickness in the two filters, and having spectral responses that can be used for numerous applications. In this filtering structure, the thicknesses of the dielectric layers are not chosen such that they are directly proportional to the wavelengths intended to be filtered by the filters of the filtering structure.

The alternation of dielectric layers of different refractive indices (for example around 2 for layers of SiN, and 1.45 for layers of $SiO_2$) enables the formation of the first and the second filters such that they have different spectral responses but comprising a good transmission of the desired wavelengths (those of the visible domain for the first filter and those of the infrared domain for the second filter) and a good rejection of the other wavelengths.

By enabling a detection and/or an emission of several spectral bands on a same detection and/or emission array, a photodetector and/or photoemitter device using such a filtering structure can synchronise information (such as images) from the different channels (spectral responses), which reduces the complexity and the cost of making such a device compared to a device using several separate detection and/or emission arrays. It is thus possible to form several different spectral filters able to be integrated on a same detection and/or emission array. In addition, the filtering structure may be made via a relatively simple method and from materials conventionally used in micro-electronic foundries, unlike filtering structures of the prior art made only with dielectric materials (which must be deposited on external substrates and impose the use of several detection arrays, and/or involving a high number of dielectric layers, and particularly a high number of layers not common between the two filters) or requiring the presence of contaminant metals such as silver.

The filtering structure may for example be made with less than 10 dielectric layers, or less than 15 dielectric layers. The number of layers of the stack of the filtering structure depends particularly on the selectivity of the desired spectral responses, in other words the tolerances as regards the transmission and the rejection of the filters of the structure.

Although the metal layer(s) of the filtering structure preferably comprise copper or aluminium, this or these layers may nevertheless comprise a contaminant metal such as silver. In this case, the filtering structure has a better transmission compared to Ag/dielectric filters of the prior art by virtue of the use of two dielectric materials of different refractive indices.

The presence of one or more additional metal layers in the second filter compared to the first filter makes it possible to avoid having to use, when the filtering structure is intended to carry out separate filterings on the one hand in the visible domain and on the other hand in the infrared domain, a black resin which is costly and complex to implement. The presence, in the first filter, of a number of metal layers less than that in the second filter makes it possible to minimise the absorption of visible light by the metal, disadvantageous in particular for blue and green, whereas the presence of a larger number of metal layers in the second filter makes it possible to improve the rejection of this filter in the visible domain.

The filtering structure may advantageously be used in the field of multispectral passive imaging (for example visible and infrared, or RGB and infrared to carry out a photodetection by day as by night), active depth imaging (3D photodetection) and colour with illumination in the near infrared (fringe projection or time of flight), or instead multispectral detection without imaging (for example to carry out a measurement of the spectral characteristics of an illuminant).

It is possible to consider that a filter carries out a transmission of the wavelengths of a first spectral band and that it cuts off the wavelengths of a second spectral band when the ratio of the average transmission in the first spectral band over the average transmission in the second spectral band is greater than 2 or 3, and preferably greater than around 10, 50 or 100.

A layer is "common" to several filters, or continuously in these filters, when at least a part of this layer is continued, or extended, in all the filters, i.e. when this part of this layer is arranged in all filters for which this layer is referred to as being "common". Thus, a layer which is common to two filters, or several filters, can have different thicknesses in these filters when this layer has, as in first filter, an initial thickness, and that only a part of that initial thickness is arranged in a second filter.

The wavelengths of the first spectral band may be less than around 600 nm and the wavelengths of the second spectral band may be greater than around 600 nm.

The first and second metal layers may comprise copper and/or aluminium, and/or the dielectric layers may comprise SiN (for example in its stoichiometric form $Si_3N_4$ or non-stoichiometric form $Si_xN_y$) and/or $SiO_2$ and/or $TiO_2$ and/or $Ta_2O_5$ and/or $HfO_2$ and/or $ZrO_2$ and/or ZnS and/or ZnSe and/or $MgF_2$ and/or SiOCH and/or $Na_3AlF_6$.

The stack of layers may comprise one or more layers of $SiO_2$ each arranged between two layers of SiN.

Each metal layer may be arranged between two dielectric layers comprising a same dielectric material. In this case, each metal layer may comprise copper or aluminium and arranged between two layers of SiN.

At least one of said dielectric layers may comprise, in the first filter, a thickness less than, or greater than, its thickness in the second filter.

In the first filter, at least one dielectric layer may comprise several portions of different thicknesses such that the first filter comprises several parts having different spectral responses.

In a variant, the filtering structure may further comprise an array of coloured filters arranged on the first filter.

The parts of the first filter having the different spectral responses or the array of coloured filters arranged on the first filter may form an array of filtering three colours red, green and blue, for example in the form of a Bayer array.

The first spectral band may correspond to the visible domain and the second spectral band may correspond to at least one part of the infrared domain.

The wavelengths of the first spectral band may correspond to the colours green and blue, and the wavelengths of the second spectral band may correspond to the colour red.

Another embodiment relates to a photodetector and/or photoemitter device comprising at least:
an array of pixels able to carry out a photodetection and/or a photoemission in the range of wavelengths of the visible domain and/or the infrared domain;
a filtering structure as described above, arranged opposite the array of pixels such that the first filter is arranged opposite a first set of pixels of the array and that the second filter is arranged opposite a second set of pixels of the array.

The filtering structure may be arranged near to or on the array of pixels.

Another embodiment relates to a method for making an optical filtering structure comprising the implementation of steps of depositing, photolithography and etching of dielectric and metal materials, forming a stack of layers forming at least one first filter able to let pass the wavelengths of a first spectral band and cut off the wavelengths of a second spectral band, and a second filter adjacent to the first filter and able to let pass the wavelengths of the second spectral band and cut off the wavelengths of the first spectral band, and wherein the stack of layers comprises:
a plurality of dielectric layers common to the first filter and to the second filter and forming an alternation of layers of different refractive indices;
n first metal layers common to the first filter and to the second filter;
m second metal layers arranged only in the second filter;
and wherein at least one of said dielectric layers comprises, in the first filter, a thickness different to that in the second filter, and/or wherein at least one dielectric layer is arranged only in the first or the second filter;
n being an integer greater than or equal to 0, and m being an integer greater than or equal to 1.

BRIEF DESCRIPTION OF DRAWINGS

The present invention will be better understood on reading the description of embodiment examples given by way of indication and in no way limiting and by referring to the appended drawings, among which.

Identical, similar or equivalent parts of the different figures described hereafter bear the same numerical references so as to make it easier to go from one figure to the next.

In order to make the figures more legible, the different parts (particularly the layers) shown in the figures are not necessarily according to a uniform scale.

The different possibilities (variants and embodiments) should be understood as not being mutually exclusive and may be combined together.

DETAILED DESCRIPTION OF PARTICULAR EMBODIMENTS

Figure 2:
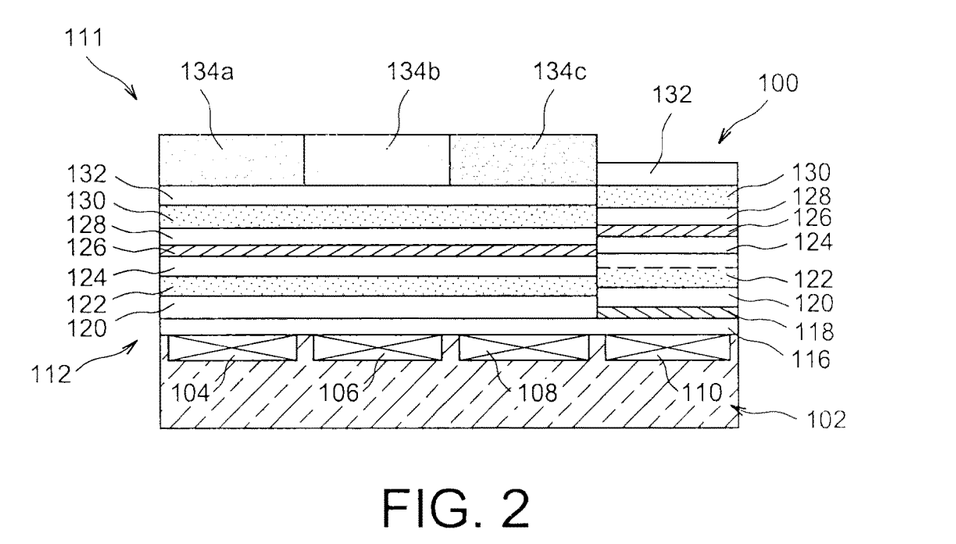
FIG. 2 represents partially and schematically a photodetector device comprising a filtering structure according to a first embodiment.

Reference is made to FIG. 2 which represents partially and schematically a photodetector device 100 able to carry out a light detection in the visible domain and in the infrared domain, according to a first embodiment.

The device 100 comprises a sensor 102, for example of CCD or CMOS type, comprising an array of pixels. A first set of pixels of the sensor 102 is intended to carry out a photodetection in the visible domain, and a second set of pixels of the sensor 102 is intended to carry out a photodetection in the infrared domain. In the example of FIG. 2, four pixels 104 to 110 are shown. The three pixels 104, 106 and 108 are intended to carry out a photodetection in the visible domain (the pixel 104 for blue, the pixel 106 for green and the pixel 108 for red), whereas the pixel 110 is intended to carry out a photodetection in the infrared domain.

The two sets of pixels may optionally be intermingled, for example in the form of a Bayer array integrating a RGB and IR filtering. In such an array, for each group of 4 pixels arranged one adjacent to the other in a square, 3 pixels are each intended to detect one of the colours red, green and blue, and the fourth pixel is intended to detect the infrared.

The sensor 102 is covered by a filtering structure 111 intended to filter the light received by the photodetector device 100. The pixels of the first set which are intended to carry out a photodetection in the visible domain (corresponding to the pixels 104, 106 and 108 in the example of FIG. 2) are covered by a first visible pass and infrared cut off filter 112, in other words the spectral response of which lets pass the wavelengths of the visible domain and cuts off the wavelengths of the infrared domain. The pixels of the second set intended to carry out a photodetection in the infrared domain (corresponding to the pixel 110 in the example of FIG. 2) are covered by a second infrared pass and visible cut off filter 114, in other words the spectral response of which lets pass the wavelengths of the infrared domain and cuts off the wavelengths of the visible domain. These two filters 112, 114 are obtained from a stack of layers made in a common manner for the two filters 112, 114. In these two filters 112, 114, the spectral transmission and rejection is obtained on account of the alternating layout of dielectric layers of different refractive indices (here layers of SiN of refractive index equal to around 2, and layers of $SiO_2$ of refractive index equal to around 1.45), as well as the presence of an additional metal layer in the second filter 114 compared to the first filter 112. Dielectric layers having a high refractive index may for example be composed of SiN (for example in the stoichiometric form $Si_3N_4$ or non-stoichiometric form $Si_xN_y$) and/or $TiO_2$ and/or $Ta_2O_5$ and/or $HfO_2$ and/or $ZrO_2$ and/or ZnS and/or ZnSe. Dielectric layers having a low refractive index may for example be composed of $SiO_2$ and/or $MgF_2$ and/or SiOCH and/or $Na_3AlF_6$. The materials of the alternating dielectric layers (alternation of high refractive index/low refractive index) having different refractive indices may be chosen such that they have a difference of refractive index greater than around 0.3, and preferably greater than around 0.5.

The metal layer(s) of the filtering structure 111 may be composed of copper (which makes it possible particularly to carry out a good filtering for the spectral band of the colour red and the infrared), and/or aluminium and/or silver and/or gold.

During the conception of the filters 112, 114, the thicknesses of the different layers of the filters are evaluated initially in an approximate manner via a calculation algorithm of multilayer filters optimising the stacks of filters considered individually, compared to the desired spectral templates. These values are then used as input data in a code that implements an overall numerical optimization technique to adjust more finely the thicknesses of the different layers of the filters 112, 114 considered simultaneously. Equality constraints are fixed between certain thicknesses of layers of the filters, to impose a constant thickness between the two filters. The filters 112, 114 are thus designed by trying to obtain a maximum of common layers of same thickness from one filter to the next.

Each filter may firstly be designed individually using multilayer optical calculation software, such as for example the Optilayer software, which uses the Abélès matrix theory to calculate the optical response of a stack of thin layers, and a "needle" type optimization method (as described in the document of A. V. Tikhonravov, M. K. Trubetskov, and G. W. DeBell, "Application of the needle optimization technique to the design of optical coatings", Applied Optics, 1996, 35, Vol. 28, pp. 5493-5508) to provide a stack of spectral responses approaching as best as possible the desired template. The filters are then considered simultaneously from the individual solutions provided by the preceding calculation software.

The optimisation making it possible to consider the layers of filters as common between them may use techniques of optimisation under constraint of simulated annealing type.

The difference between the spectral responses of the two filters 112, 114 stems from the variation in the thickness of at least one of the dielectric layers between the two filters (here a layer of $SiO_2$, the thickness of which in the second filter 114 is greater than its thickness in the first filter 112), as well as the presence of an additional metal layer in the second infrared pass and visible cut off filter 114 compared to the first infrared cut off and visible pass filter 112.

The realization of the different layers of the stack of the filtering structure 111 according to the first embodiment of FIG. 2 will now be described.

The filters 112 and 114 are made by depositing firstly, for example by PECVD, a first layer of SiN 116, the thickness of which is equal to around 85 nm. A first metal layer 118, for example composed of copper and the thickness of which is equal to around 38 nm, is then deposited on the first layer of SiN 116. This first layer of copper 118 is photolithographied and etched in order to only conserve this first layer of copper 118 at the second filter 114, in other words opposite the pixels intended to carry out a photodetection in the infrared domain (in other words the pixel 110 in the example of FIG. 2). The resin used to carry out this photolithography is then eliminated.

The deposit is then carried out of a second layer of SiN 120, the thickness of which is for example equal to around 15 nm. On account of the presence of the first layer of copper 118 only in the second filter 114, the part of the second layer of SiN 120 in the first filter 112 is not arranged on a same plane as that in the second filter 114.

It is then desired to make, on the second layer of SiN 120, a first layer of $SiO_2$ 122 comprising, at the first filter 112, a thickness equal to around 84 nm, and at the second filter 114, a thickness equal to around 191 nm. To do this, a first deposit is firstly carried out, on the second layer of SiN 120, of $SiO_2$ of thickness equal to around 107 nm (191 nm–84 nm=107 nm). This deposit of SiO$_2$ is photo-lithographied and etched in order to only conserve the SiO$_2$ at the second filter 114, in other words opposite the pixels intended to carry out a photo-detection in the infrared domain (pixel 110 in the example of FIG. 2). The resin used to carry out this photolithography is then eliminated. The first layer of SiO$_2$ 122 is then finished by making a second deposit of SiO$_2$ of thickness equal to around 84 nm. This second deposit of SiO$_2$ covers, at the first filter 112, the second layer of SiN 120, and at the filter 114, the first deposit of SiO$_2$.

The filters 112 and 114 of the filtering structure 111 are then finished by the deposits of the following layers which are common and which comprise a same thickness in the two filters 112, 114:

- a third layer of SiN 124 of thickness equal to around 27 nm;
- a second metal layer 126, here composed of copper and of thickness equal to around 23 nm;
- a fourth layer of SiN 128 of thickness equal to around 62 nm;
- a second layer of SiO$_2$ 130 of thickness equal to around 15 nm;
- a fifth layer of SiN 132 of thickness equal to around 62 nm.

The table below summarises the thicknesses of the dielectric and metal layers used to make the two filters 112 and 114 of the filtering structure 111. The order of the layers indicated in this table corresponds to the stacking order, from the bottom to the top of the table, of the layers in the filtering structure 111.

|  | 1$^{st}$ filter 112 | 2$^{nd}$ filter 114 |
|---|---|---|
| SiN layer 132 |  | 62 nm |
| SiO$_2$ layer 130 |  | 15 nm |
| SiN layer 128 |  | 62 nm |
| Cu layer 126 |  | 23 nm |
| SiN layer 124 |  | 27 nm |
| SiO$_2$ layer 122 | 84 nm | 191 nm |
| SiN layer 120 |  | 15 nm |
| Cu layer 118 | 0 | 38 nm |
| SiN layer 116 |  | 85 nm |

Figure 3:
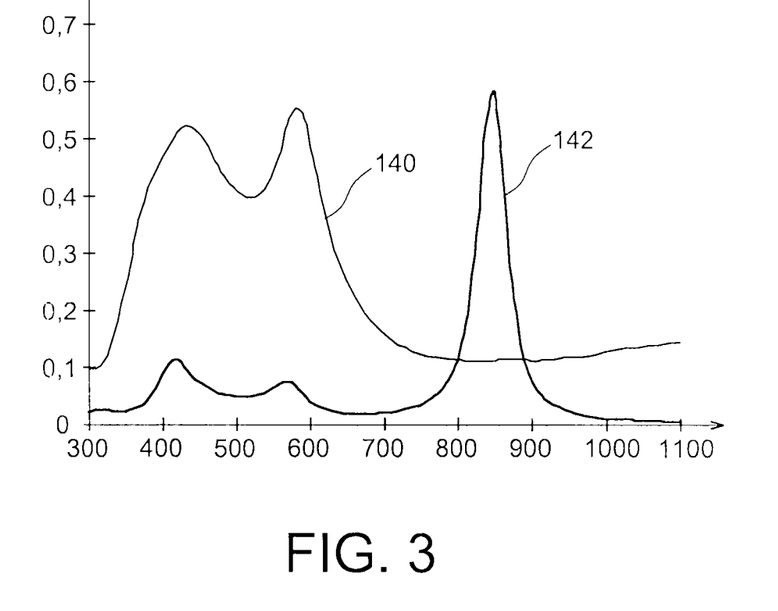
FIG. 3 represents the spectral responses of the filters of the filtering structure according to the first embodiment.

The spectral responses (value of the coefficient of transmission as a function of the wavelength in nm) of the filters 112 and 114, respectively referenced 140 and 142, are shown in FIG. 3.

The value "0" indicated for the copper layer 118 at the first filter 112 indicates that this layer is absent at the first filter 112 and that it is thus only present in the second filter 114. The second filter 114, which is infrared pass and visible cut off, thus comprises an additional metal layer (first layer of copper 118) compared to the first filter 112 which is visible pass and infrared cut off. The presence of a single layer of copper in the stack of layers forming the first filter 112 makes it possible to minimise the absorption of visible light by the metal, disadvantageous in particular in the blue and the green, whereas the presence of two layers of copper in the stack of the infrared pass filter 114 makes it possible to improve the rejection of this filter in the visible domain.

The variation in thickness of the first layer of SiO$_2$ 122 between the two filters 112 and 114 makes it possible to improve the transmission and the rejection of certain spectral bands in a more specific manner for each of the two filters 112, 114. The other layers are common to these two filters 112, 114 and have similar thicknesses in the two filters 112, 114. The difference between the spectral responses of the two filters 112, 114 is due to:

- the presence of an additional metal layer (layer 118) in the second filter 114 compared to the first filter 112;
- the variation in thickness of a single dielectric layer (layer 122) between the two filters 112 and 114, all the other layers being common and similar in the two filters 112, 114.

In this example, the maximum transmission of the two filters 112, 114, of the order of 50%, and the rejection outside of the resonance, are sufficient for numerous envisaged applications. The spectral responses of the filters 112, 114 could be optimised if a greater number of layers is envisaged to make these filters.

In order to carry out a detection of the red, green and blue components of the visible spectrum, coloured filters 134 are made on the fifth layer of SiN 132, opposite the pixels of the sensor 102 intended to carry out a photo-detection in the visible domain, in other words on the first filter 112, opposite the pixels of the first set of pixels. These coloured filters 134 are for example made from coloured resins. In the example of FIG. 2, a coloured filter 134a of blue colour is arranged opposite the pixel 104, a coloured filter 134b of green colour is arranged opposite the pixel 106 and a coloured filter 134c of red colour is arranged opposite the pixel 108. The spreading and the control of the thickness of the resins on the layers of the filters 112 and 114 is possible from the moment that the relief (difference in total thickness between the filters 112 and 114) is less than the thickness of the resins to be deposited. In the example described previously, the difference in thickness between the two filters 112, 114 is only around 145 nm, which is less than the thickness of the coloured organic resins used to make the coloured filters 134 (comprised between around 800 to 1000 nm).

To make the coloured filters 134, a first coloured resin (for example red) is firstly spread by spin-coating on the fifth layer of SiN 132, at the two filters 112 and 114. The spread resin is then hardened by annealing, then photo-lithographied and finally developed to define the patterns provided for the red coloured filters (in other words localised above the pixels intended to carry out a photodetection in the spectral band of the colour red, corresponding to the pixel 108 in FIG. 2). These operations are then repeated with resins of two other colours.

In the example described previously, the device 100 is a photodetector device. In a variant, the device 100 could be a photoemitter device. In this case, compared to the device 100 described, the sensor 102 could be replaced by a substrate comprising light emitting means (emitting in the visible and infrared spectral bands) on which the filters 112 and 114 would be arranged, as well as optionally the coloured filters 134 if it is wished to carry out, in the visible domain, emissions in spectral bands restricted to precise colours. It would also be possible to have a photodetector and photoemitter device, the light emitting means being in this case combined with the photodetectors under the filters 112 and 114.

The following table gives the thicknesses of dielectric and metal layers used to make the two filters 112 and 114 according to a first variant of the filtering structure 111 of the first embodiment. As for the previous table, the order of the layers indicated in this table corresponds to the stacking order, from the bottom to the top of the table, of the layers in the filtering structure according to this first embodiment variant.

|  | 1st filter 112 | 2nd filter 114 |
| --- | --- | --- |
| SiN layer |  | 108 nm |
| SiO₂ layer |  | 144 nm |
| SiN layer |  | 105 nm |
| SiO₂ layer |  | 157 nm |
| SiN layer | 0 | 82 nm |
| Cu layer | 0 | 38 nm |
| SiN layer |  | 90 nm |
| SiO₂ layer |  | 143 nm |
| SiN layer |  | 106 nm |
| SiO₂ layer |  | 144 nm |
| SiN layer |  | 107 nm |

The "0" values indicated for the copper layer and one of the layers of SiN at the first filter 112 indicate that these layer are absent at the first filter 112 and that they are present only in the second filter 114.

As previously, the filtering structure according to this first embodiment variant comprises dielectric layers of different refractive indices arranged in an alternating manner (alternation of high and low refractive indices). On the other hand, in this first embodiment variant, the second infrared pass and visible cut-off filter 111 comprises a single metal layer, here composed of copper, and the first visible pass and infrared cut off filter 112 does not comprise any metal layer and is only composed of an alternation of dielectric layers of different refractive indices. In addition, in this first embodiment variant, one of the dielectric layers is only present in the second filter 114.

Figure 6:
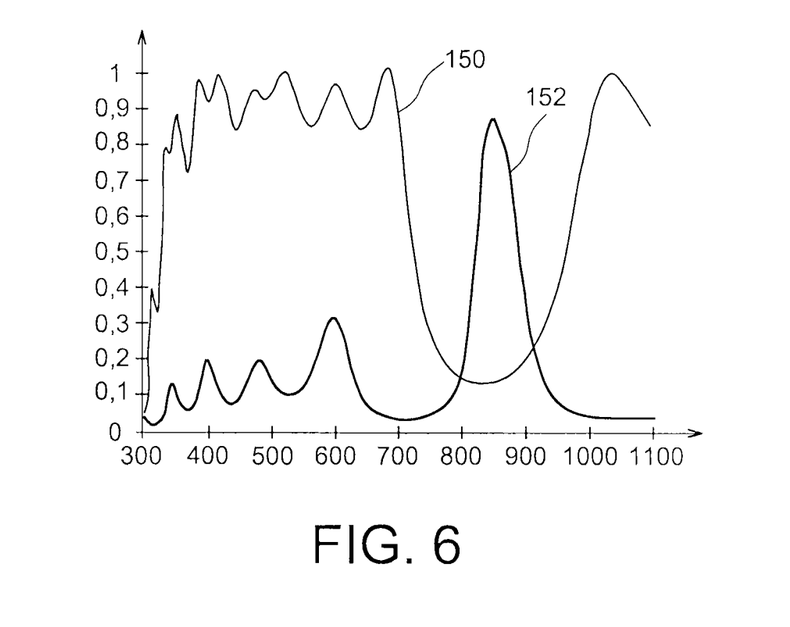
FIGS. 6 and 7 represent the spectral responses of the filters of the filtering structure according to different variants of the first embodiment.

The spectral responses (value of the coefficient of transmission as a function of the wavelength in nm) of the filters 112 and 114 of the filtering structure according to this first embodiment variant, respectively referenced 150 and 152, are shown in FIG. 6.

The following table gives the thicknesses of dielectric and metal layers used to make the two filters 112 and 114 according to a second variant of the filtering structure 111 of the first embodiment. As for the preceding table, the order of the layers indicated in this table correspond to the stacking order, from the bottom to the top of the table, of the layers of the filtering structure according to this second embodiment variant.

|  | 1st filter 112 | 2nd filter 114 |
| --- | --- | --- |
| SiN layer |  | 108 nm |
| SiO2 layer |  | 148 nm |
| SiN layer |  | 108 nm |
| Cu layer | 0 | 15 nm |
| SiN layer | 0 | 175 nm |
| Cu layer | 0 | 37 nm |
| SiN layer | 0 | 85 nm |
| SiO2 layer |  | 148 nm |
| SiN layer |  | 108 nm |
| SiO2 layer |  | 148 nm |
| SiN layer |  | 108 nm |
| SiO2 layer |  | 148 nm |
| SiN layer |  | 109 nm |

The "0" values indicated for the layers of copper and two of the layers of SiN at the first filter 112 indicate that these layer are absent at the first filter 112 and that they are thus only present in the second filter 114.

As previously, the filtering structure according to this second embodiment variant comprises dielectric layers of different refractive indices arranged in an alternating manner with respect to each other. In this second embodiment variant, the second infrared pass and visible cut off filter 114 comprises two metal layers, here composed of copper, and the first visible pass and infrared cut off filter 112 do not comprise any metal layer and is only composed of an alternation of dielectric layers of different refractive indices. In addition, all the layers that are common to these two filters 112 and 114 have a constant thickness from one filter to the next. Two dielectric layers composed of SiN are present only in the second filter 114.

Figure 7:
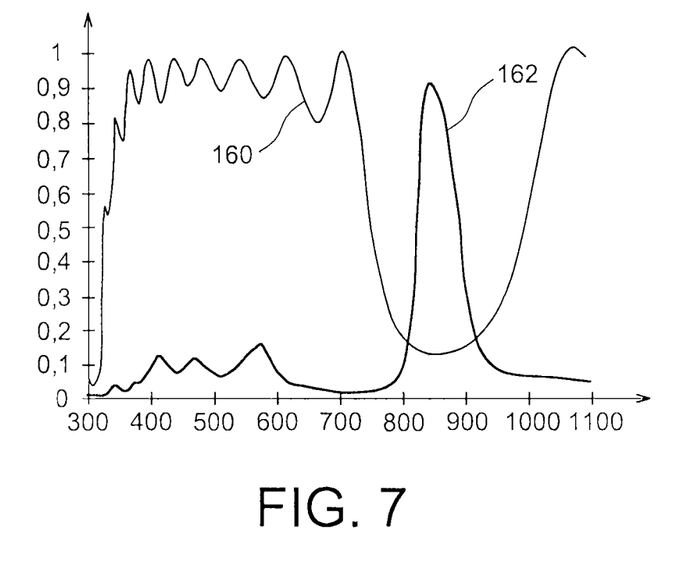

The spectral responses (value of the coefficient of transmission as a function of the wavelength in nm) of the filters 112 and 114 of the filtering structure according to this second embodiment variant, respectively referenced 160 and 162, are shown in FIG. 7.

In FIGS. 6 and 7, it can be seen that the spectral responses 150 and 160 of the visible pass and infrared cut off filters of the filtering structures show a rise in their coefficient of transmission in the infrared domain, above around 950 nm. Nevertheless, such a rise is not bothersome when such a filtering structure is coupled to a sensor and/or an emitter composed of silicon which is not very sensitive to these wavelengths.

Figure 4:
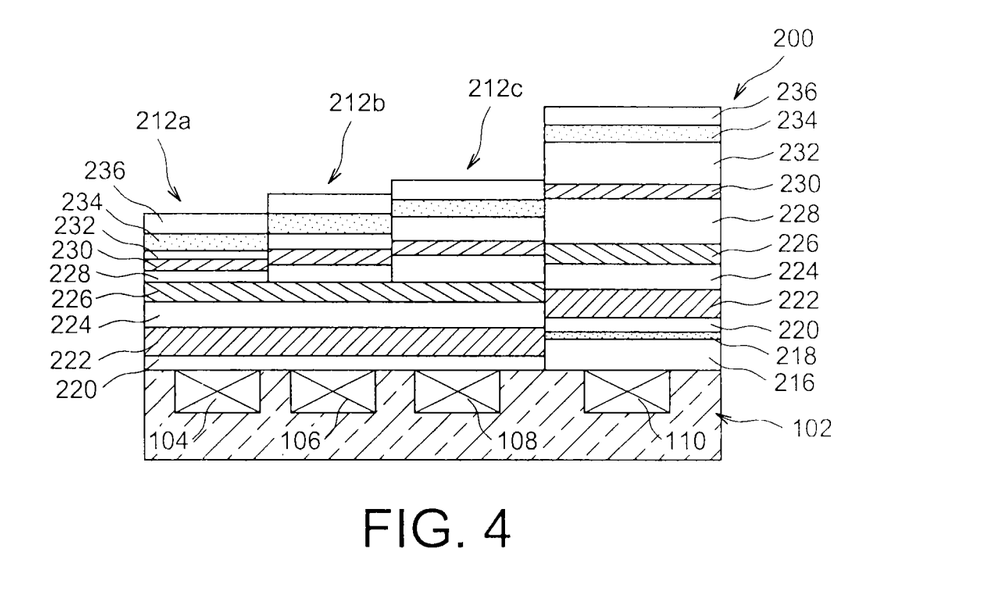
FIG. 4 represents partially and schematically a photodetector device comprising a filtering structure according to a second embodiment.

Reference will now be made to FIG. 4 which shows partially and schematically a photodetector device 200 able to carry out a light detection in the visible and infrared domains, according to a second embodiment.

Like the device 100 described previously, the device 200 comprises the sensor 102 described previously. The sensor 102 is covered by a filtering structure 211 which comprises a first filter 212 of visible pass and infrared cut off type, and a second filter 214 of infrared pass and visible cut off type. As for the filters 112, 114 described previously, the filters 212 and 214 are made from a stack of layers, most of which are common to these two filters. In addition, as for the filters 112, 114, the transmission and the spectral rejection carried out by the filters 212 and 214 are obtained on account of the use of dielectric layers of different refractive indices (layers of SiN and layers of SiO₂ in the example described here), as well as the presence of an additional metal layer in the second filter 214 compared to the first filter 212.

Nevertheless, unlike the filtering structure 111 which uses coloured resins to carry out, within the visible spectrum, the filtering of the colours red, green and blue, the first filter 212 comprises layers that have variable thicknesses even within the first filter 212 in order to carry out the different filterings desired in the visible domain, for example a function of RGB filtering. Thus, the first filter 212 comprises a first part 212*a* arranged opposite the pixels intended to capture the spectral band corresponding to the colour blue (pixel 104 in the example of FIG. 4) and forming a filter letting pass only this spectral band. In the same way, parts 212*b* and 212*c* arranged opposite the pixels intended to capture respectively the spectral bands corresponding to the colours green and red (pixels 106 and 108 in the example of FIG. 4) form filters letting pass only these spectral bands.

The table below gives the thicknesses of the dielectric and metal layers used to make the two filters 212, 214.

|  | 1st filter 212 | | | |
| --- | --- | --- | --- | --- |
|  | 212a | 212b | 212c | 2nd filter 214 |
| SiN 236 |  |  | 66 nm |  |
| SiO2 234 |  |  | 69 nm |  |
| SiN 232 | 36 nm | 55 nm | 71 nm | 156 nm |
| Cu 230 |  |  | 34 nm |  |
| SiN 228 | 27 nm | 50 nm | 69 nm | 139 nm |
| SiO2 226 |  |  | 68 nm |  |
| SiN 224 |  |  | 86 nm |  |
| SiO2 222 |  |  | 95 nm |  |
| SiN 220 |  |  | 31 nm |  |
| Cu 218 |  |  | 0 | 16 nm |
| SiN 216 |  |  | 0 | 102 nm |

Figure 5:
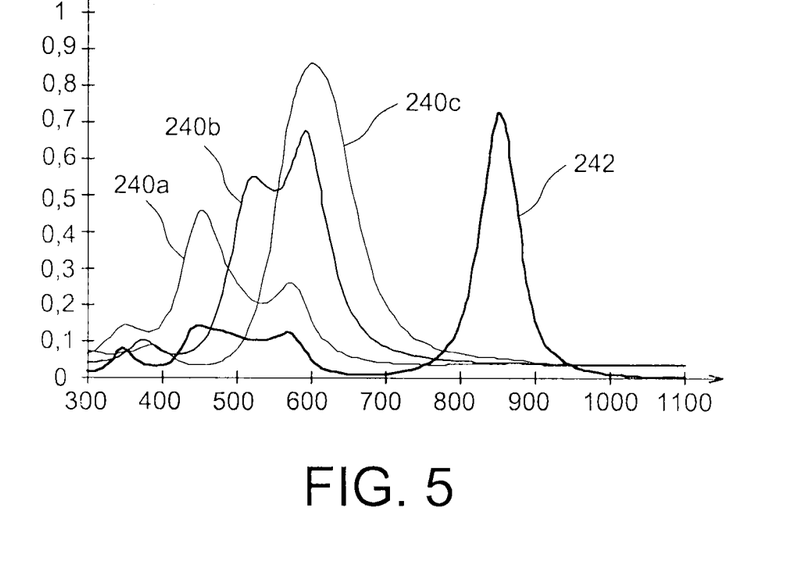
FIG. 5 represents the spectral responses of the filters of the filtering structure according to the second embodiment.

The spectral responses of the parts 212a, 212b, 212c of the first filter 212, respectively referenced 240a, 240b and 240c, and the spectral response of the second filter 214, bearing the reference 242, are shown in FIG. 5.

The differences between the two filters 212 and 214 are:
- the presence of a single layer of Cu in the stack of layers of the first filter 212, and two layers of Cu in the stack of the second filter 214;
- the variation in thickness of two dielectric layers (composed of SiN in this example) between the two filters 212 and 214;
- the presence of an additional dielectric layer (here comprising SiN) in the second filter 214 compared to the first filter 212.

In addition, within the first filter 212, the filtering of the different RGB spectral bands is obtained on account of the fact that the two dielectric layers of different thicknesses between the two filters 212 and 214 also have different thicknesses within the different parts 212a, 212b and 212c of the first filter 212.

All the other layers of the stack of the filtering structure 211 are common and of constant thickness in the two filters 212 and 214.

As for the filtering structure 111, the stack of layers of the filtering structure 211 makes it possible to make the second filter 214 which cuts off the wavelengths of the visible domain without using a black resin.

As for the device 100, the device 200 could be a photoemitter device, or instead a photodetector and photoemitter device.

In a variant, the devices 100 and 200 could be able to carry out a light detection and/or a light emission only in the visible domain, or in the infrared domain. In this case, the presence of an additional metal layer in the second filter could be taken advantage of so that the first filter is able to carry out a filtering of a spectral band corresponding to the colours blue and green, and that the second filter, which comprises the additional metal layer, is able to carry out a filtering of a spectral band corresponding to the colour red. The table below corresponds to an example embodiment of a filtering structure of a device capable of performing a light detection and/or a light emission only in the visible domain. In this structure, the first filter comprises a first part adapted to carry out a filtering of the spectral band corresponding to the blue color and a second part adapted to carry out a filtering of the spectral band corresponding to the green color, and the second filter, which comprises an additional metal layer, is able to perform a filtering of a spectral band corresponding to the color red.

|      | 1st filter | | 2nd filter |
| --- | --- | --- | --- |
|      | 1st part | 2nd part | 2nd filter |
| SiN  |          | 66 nm    |         |
| SiO2 |          | 69 nm    |         |
| SiN  | 36 nm    | 55 nm    | 71 nm   |
| Cu   |          | 34 nm    |         |
| SiN  | 27 nm    | 50 nm    | 69 nm   |
| SiO2 |          | 68 nm    |         |
| SiN  | 0        |          | 130 nm  |
| Cu   | 0        |          | 16 nm   |
| SiN  |          | 86 nm    |         |
| SiO2 |          | 95 nm    |         |
| SiN  |          | 31 nm    |         |

The additional layer of copper included in the second filter and not in the first filter further improves the selectivity, and especially the rejection, of the second filter.

Figure 8:
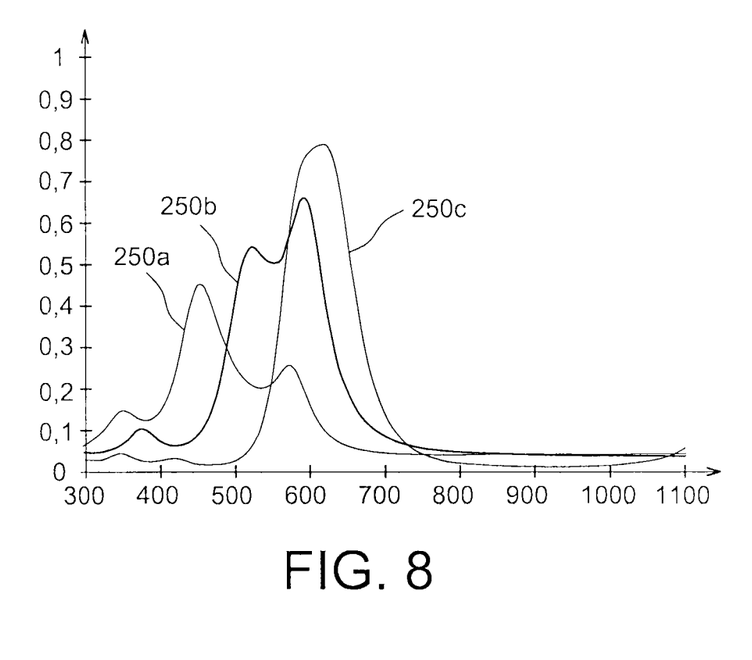
FIG. 8 represents the spectral responses of the filters of the filtering structure according to a variant embodiment.

The spectral responses of the first part of the first filter, the second part of the first filter and the second filter, respectively referenced 250a, 250b and 250c, are shown in FIG. 8.

In all embodiments and examples previously described, when the metal layer(s) comprise copper, the sharp drop in the value of the refractive index of the copper around wavelengths comprised between around 550 nm and 600 nm is then judiciously used.

The stacks of layers described above may be formed on a substrate $SiO_2$-based, and the upper layer of these stacks may be in contact with a superstrate made of air.

The invention claimed is:

1. An optical filtering structure comprising a stack of layers forming at least one first filter letting pass the wavelengths of a first spectral band and cutting off the wavelengths of a second spectral band, and a second filter adjacent to the first filter and letting pass the wavelengths of the second spectral band and cutting off the wavelengths of the first spectral band, wherein the stack of layers comprises:
   a plurality of dielectric layers common to the first filter and to the second filter and forming an alternation of layers of different refractive indices;
   n first metal layers common to the first filter and to the second filter, wherein each first metal layer comprises at least one of copper, aluminium, and silver;
   m second metal layers arranged only in the second filter, wherein each second metal layer comprises at least one of copper, aluminium, and silver,
   wherein at least one of said dielectric layers has a same thickness in the first and second filters;
   and wherein at least one of said dielectric layers comprises, in the first filter, a thickness different to that in the second filter, and/or wherein at least one dielectric layer is arranged only in the first or the second filter;
   n being an integer greater than or equal to 0, and m being an integer greater than or equal to 1.

2. The optical filtering structure according to claim 1, wherein the wavelengths of the first spectral band are less than around 600 nm and the wavelengths of the second spectral band are greater than around 600 nm.

3. The optical filtering structure according to claim 1, wherein the dielectric layers comprise at least one of SiN, $SiO_2$, $TiO_2$, $Ta_2O_5$, $HfO_2$, $ZrO_2$, ZnS, ZnSe, $MgF_2$, SiOCH, and $Na_3AlF_6$.

4. The optical filtering structure according to claim 1, wherein the stack of layers comprises one or more layers of $SiO_2$ each arranged between two layers of SiN.

5. The optical filtering structure according to claim 1, wherein each metal layer is arranged between two dielectric layers comprising a same dielectric material.

6. The optical filtering structure according to claim 5, wherein each metal layer comprises copper and is arranged between two layers of SiN.

7. The optical filtering structure according to claim 1, wherein, in the first filter, at least one dielectric layer comprises several portions of different thicknesses such that the first filter comprises several parts having different spectral responses.

8. The optical filtering structure according to claim 7, wherein the parts of the first filter having the different spectral responses form a filtering array of three colours red, green and blue.

9. The optical filtering structure according to claim 7, wherein the wavelengths of the first spectral band correspond to the colours green and blue, and the wavelengths of the second spectral band correspond to the colour red.

10. The optical filtering structure according to claim 1, further comprising an array of coloured filters arranged on the first filter.

11. The optical filtering structure according to claim 10, wherein the array of coloured filters arranged on the first filter form a filtering array of three colours red, green and blue.

12. The optical filtering structure according to claim 10, wherein the wavelengths of the first spectral band correspond to the colours green and blue, and the wavelengths of the second spectral band correspond to the colour red.

13. The optical filtering structure according to claim 1, wherein the first spectral band corresponds to the visible domain and the second spectral band corresponds to at least one part of the infrared domain.

14. A photodetector and/or photoemitter device comprising at least:
  one array of pixels able to carry out a photodetection and/or a photoemission in the range of wavelengths of the visible domain and/or the infrared domain;
  one filtering structure according to claim 1 arranged opposite the array of pixels such that the first filter is arranged opposite a first set of pixels of the array and that the second filter is arranged opposite a second set of pixels of the array.

15. The optical filtering structure of claim 1, wherein n being an integer greater than or equal to 1, and m being an integer greater than or equal to 2.

16. A method for making an optical filtering structure comprising the implementation of steps of depositing, photolithography and etching of dielectric and metal materials, forming a stack of layers forming at least one first filter letting pass the wavelengths of a first spectral band and cutting off the wavelengths of a second spectral band, and a second filter adjacent to the first filter and letting pass the wavelengths of the second spectral band and cutting off the wavelengths of the first spectral band, and wherein the stack of layers comprises:
  a plurality of dielectric layers common to the first filter and to the second filter and forming an alternation of layers of different refractive indices;
  n first metal layers common to the first filter and to the second filter wherein each first metal layer comprises at least one of copper, aluminium, and silver;
  m second metal layers arranged only in the second filter, wherein each second metal layer comprises at least one of copper, aluminium, and silver,
  wherein at least one of said dielectric layers has a same thickness in the first and second filters;
  and wherein at least one of said dielectric layers comprises, in the first filter, a thickness different to that in the second filter, and/or wherein at least one dielectric layer is arranged only in the first or the second filter;
  n being an integer greater than or equal to 0, and m being an integer greater than or equal to 1.

17. The method of claim 16, wherein n being an integer greater than or equal to 1, and m being an integer greater than or equal to 2.

* * * * *